United States Patent
Dai

(10) Patent No.: US 8,466,377 B2
(45) Date of Patent: Jun. 18, 2013

(54) ELECTRONIC DEVICE HOUSING

(75) Inventor: Bin Dai, ShenZhen (CN)

(73) Assignees: Fu Tai Hua Industry (Shenzhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 232 days.

(21) Appl. No.: 12/965,852

(22) Filed: Dec. 11, 2010

(65) Prior Publication Data
US 2012/0031666 A1    Feb. 9, 2012

(30) Foreign Application Priority Data
Aug. 3, 2010    (CN) .......................... 2010 1 0244041

(51) Int. Cl.
*H05K 5/00*    (2006.01)
*H05K 7/00*    (2006.01)
*H01R 13/502*    (2006.01)
*H01L 23/02*    (2006.01)
*A47B 81/00*    (2006.01)
*A47B 88/00*    (2006.01)

(52) U.S. Cl.
USPC ................. 174/561; 361/679.03; 361/679.23; 361/679.24; 361/679.29; 174/562; 174/563; 174/564; 312/274; 312/312; 312/317.3; 312/223.2; 312/31.1

(58) Field of Classification Search
USPC ............ 361/679.01, 679.02, 679.08, 679.09, 361/679.3, 679.55–679.59; 174/250–256, 174/561
See application file for complete search history.

(56) References Cited

U.S. PATENT DOCUMENTS
2010/0061040 A1*  3/2010  Dabov et al. ............. 361/679.01

* cited by examiner

*Primary Examiner* — Zachary M Pape
*Assistant Examiner* — Jerry Wu
(74) *Attorney, Agent, or Firm* — Altis Law Group, Inc.

(57) ABSTRACT

An electronic device housing includes a first housing, a second housing, and a plurality of frames. The first housing comprises a bottom plate and a side plate extending from an edge of the bottom plate. The side plate of the first housing is welded to the second housing. The frames are fixed to the first housing. Each frame forms a restricting portion connecting the second housing.

7 Claims, 6 Drawing Sheets

ELECTRONIC DEVICE HOUSING

CROSS-REFERENCE TO RELATED APPLICATIONS

This application is related to two co-pending U.S. patent applications, which are: application Ser. Nos. 12/964,915, 12/966,108, and both entitled "ELECTRONIC DEVICE HOUSING." Such applications have the same assignee as the instant application and are concurrently filed herewith. The disclosure of the above-identified applications is incorporated herein by reference

BACKGROUND

1. Technical Field

The present disclosure relates generally to electronic device housings and, more particularly, to an electronic device housing formed by welding.

2. Description of Related Art

Referring to FIGS. 5 and 6, an electronic device housing 10 includes a bottom housing 11 and top cover 11. The periphery of the top cover 12 is welded to the bottom housing 11. The top cover 12 and the bottom housing 11 are held together by a clamping member (not shown) during welding process.

However, the top cover 12 easily deviates from the clamped welding position because the cover is smooth and can drift during welding. As a result, the electronic device housing 10 can present a poor appearance after welding. In addition, the top cover 12 is only welded to the bottom housing 11 along the periphery thereof, such that mechanical strength of the electronic device housing 10 is relatively low.

Therefore, there is room for improvement within the art.

BRIEF DESCRIPTION OF THE DRAWINGS

The components in the drawings are not necessarily drawn to scale, the emphasis instead placed upon clearly illustrating the principles of the present disclosure. Moreover, in the drawings, like reference numerals designate corresponding parts throughout the several views.

DETAILED DESCRIPTION

Figure 1:
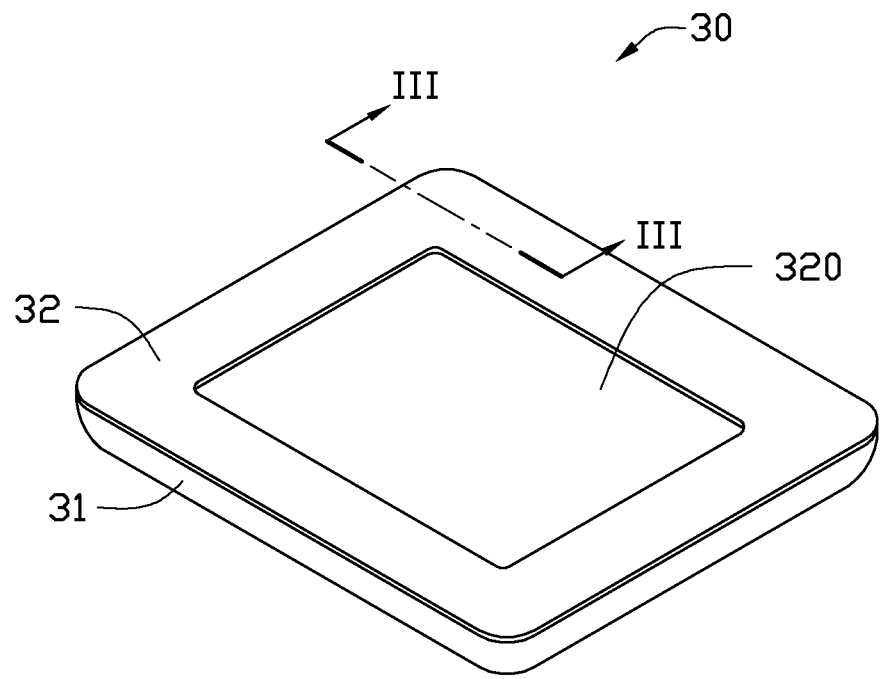
FIG. 1 is an isometric view of a first embodiment of an electronic device housing.
Figure 2:
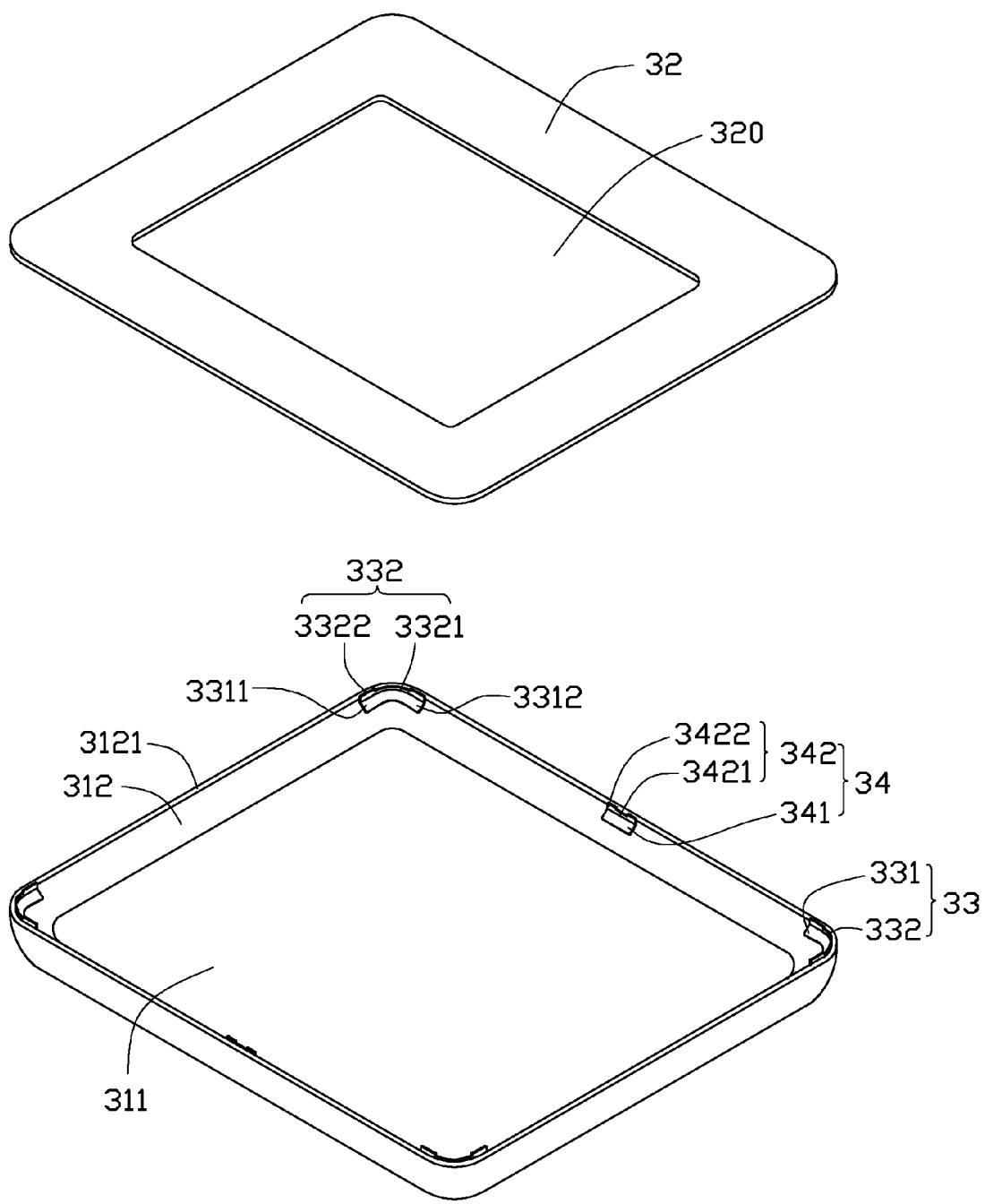
FIG. 2 an exploded, isometric view of the electronic device housing of FIG. 1.
Figure 3:
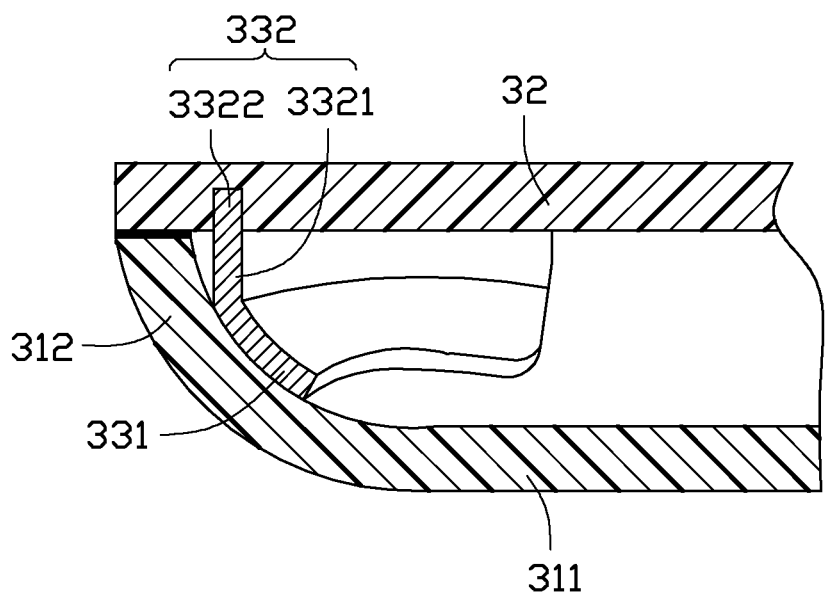
FIG. 3 is a partial cross-section of the electronic device housing of FIG. 1, taken along the line III-III.

Referring to FIGS. 1 through 3, a first embodiment of an electronic device housing 30 includes a first housing 31, a second housing 32, a first frame 33, and a second frame 34. The first frame 33 and the second frame 34 connect the first housing 31 to the second housing 32. In the illustrated embodiment, the first housing 31 is a bottom housing, and the second housing 32 is a top cover. In the illustrated embodiment, the electronic device housing 30 includes four first frames 33 and two second frames 34.

The first housing 31 includes a substantially rectangular bottom plate 311 and a curved side plate 312 extending from an edge of the bottom plate 311. A welding surface 3121 is formed at the top end of the side plate 312.

The second housing 32 is substantially rectangular, and defines an assembly groove 320 in a center for receiving display panel (not shown). An inner surface of the second housing 32 further defines a plurality of restricting holes (not labeled) around the assembly groove 320. The periphery of the second housing 32 is welded to the welding surface 3121 of the first housing 31.

The first frames 33 are respectively positioned at four corners of the first housing 31. Each first frame 33 includes a welding portion 331 and a restricting portion 332 extending from an end of the welding portion 331. The welding portion 331 includes a first welding section 3311 and a second welding section 3312 substantially perpendicular to the first welding section 3311. Both the first welding section 3311 and the second welding section 3312 are curved. The restricting portion 332 includes a main portion 3321 and two restricting pieces 3322 extending from an end of the main portion 3321 away from the welding portion 331. In the illustrated embodiment, the main portion 3321 is curved. The restricting pieces 3322 are substantially rectangular.

The second frames 34 are respectively positioned on opposite side plate 312 of the first housing 31. Each second frame 34 includes a welding portion 341 and a restricting portion 342 extending from an end of the welding portion 341. The restricting portion 342 includes a main portion 3421 and two restricting pieces 3422 extend from an end of the main portion 3421 away from the welding portion 341. In the illustrated embodiment, the main portion 3421 is curved. The restricting pieces 3422 are substantially rectangular.

In welding the electronic device housing 30, the welding portions 331 of the first frames 33 and the welding portions 341 of the second frames 34 are welded to the first housing 31. The restricting pieces 3322 of the first frames 33 and the restricting pieces 3422 of the second frames 33 are received in the restricting holes of the second housing 32. The first housing 31 and the second housing 32 are clamped by a clamping member (not shown), and together transferred to a welding device (not shown) for welding.

Because the first housing 31 and the second housing 32 are fixed together via the first frames 33 and the second frames 34, the first housing 31 cannot slide relative to the second housing 32, that is, the first housing 31 and the second housing 32 will not deviate from the predetermined positions. Therefore, the first housing 31 and the second housing 32 can be welded accurately, and the electronic device housing 30 will have a good appearance. In addition, the first housing 31 not only connects to the second housing 32 by welding, but also connects to the second housing 32 via the first frames 33 and the second frames 34, thereby enhancing the connecting strength of the first housing 31 and the second housing 32.

It should be appreciated that the first housing 31 can be the top cover, and the second housing can be the bottom housing welded to the top cover. The welding portions 331, 341 may be other shapes, such as rectangular flat pieces if the side plate 312 is flat.

Figure 4:
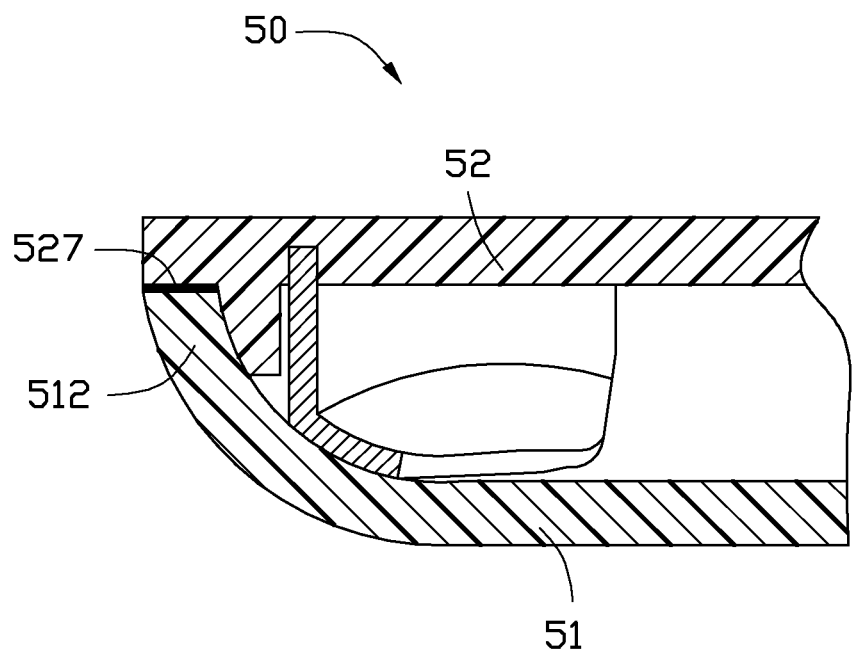
FIG. 4 is a partial cross-section of a second embodiment of an electronic device housing.
Figure 5:
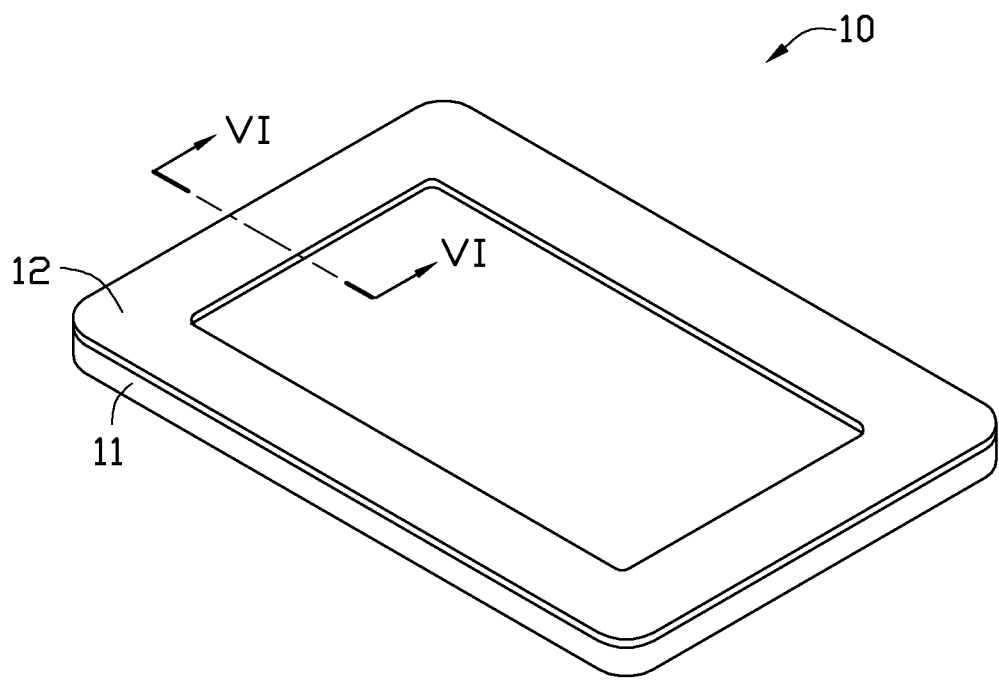
FIG. 5 is an isometric view of a commonly used electronic device housing.
Figure 6:
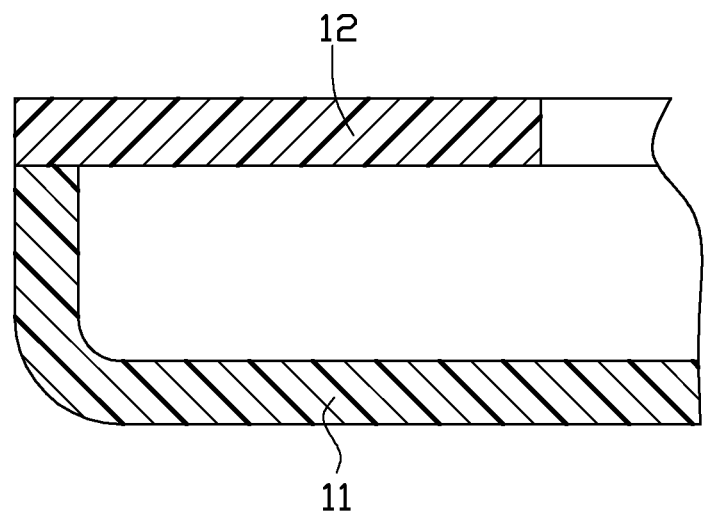
FIG. 6 is a partial cross-section of the electronic device housing of FIG. 5, taken along line VI-VI.

Referring to FIG. 4, a second embodiment of an electronic device housing 50 differs from electronic device housing 30 only in that second housing 52 defines a receiving groove 527 in an edge for receiving the side plate 512 of the first housing 51. The side plate 512 is welded to the inner surface in the receiving groove 527. The electronic device housing 50 exhibits relatively high connecting strength, because the second housing 52 defines the receiving groove 527 for positioning the first housing 51.

It is believed that the present embodiments and their advantages will be understood from the foregoing description, and it will be apparent that various changes may be made thereto without departing from the spirit and scope of the disclosure or sacrificing all of its material advantages.

What is claimed is:

1. An electronic device housing, comprising:
a first housing comprising four corners;
a second housing welded to a top edge of the first housing, the second housing defining an assembly groove for receiving a display panel; and
four first frames fixed to the first housing, wherein the four first frames are separately welded at the four corners of the first housing with a curved shape, and each of the four first frames comprises a restricting portion connecting the second housing; and
the restricting portion comprises a main portion welded to the four corners of the first housing and at least one restricting piece extending from an end of the main portion; the second housing defines at least one restricting hole for receiving the at least one restricting piece in a vertical direction.

2. The electronic device housing of claim 1, wherein the restricting portion comprises a main portion and at least one restricting piece extending from an end of the main portion; the second housing defines at least one restricting hole for receiving the at least one restricting piece.

3. The electronic device housing of claim 1, wherein the at least one frame further comprises a welding portion connected to the restricting portion welded to the first housing.

4. The electronic device housing of claim 3, wherein the first housing comprises a bottom plate and a side plate extending from an edge of the bottom plate.

5. The electronic device housing of claim 4, wherein the side plate is curved.

6. The electronic device housing of claim 5, wherein the welding portion comprises a first welding section and a second welding section substantially perpendicular to the first welding section, and the first welding section and the second welding section are curved.

7. The electronic device housing of claim 1, wherein the second housing defines an assembly groove.

* * * * *